US008921986B2

(12) United States Patent
Dix et al.

(10) Patent No.: US 8,921,986 B2
(45) Date of Patent: Dec. 30, 2014

(54) INSULATED BUMP BONDING

(71) Applicant: Microchip Technology Incorporated, Chandler, AZ (US)

(72) Inventors: Gregory Dix, Tempe, AZ (US); Roger Melcher, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/831,682

(22) Filed: Mar. 15, 2013

(65) Prior Publication Data

US 2014/0264796 A1 Sep. 18, 2014

(51) Int. Cl.
*H01L 23/495* (2006.01)

(52) U.S. Cl.
CPC ................... *H01L 23/4952* (2013.01)
USPC ............ 257/673; 257/E23.052; 257/E23.033; 257/738; 257/737; 257/784; 257/786

(58) Field of Classification Search
CPC ..... H01L 23/482; H01L 23/495; H01L 29/40; H01L 23/48; H01L 23/52; H01L 23/28
USPC .......... 257/738, E23.052, E23.033, 737, 784, 257/786
See application file for complete search history.

(56) References Cited

U.S. PATENT DOCUMENTS

| 5,831,337 | A | * | 11/1998 | Sato | 257/780 |
| 6,166,436 | A | * | 12/2000 | Maeda et al. | 257/723 |
| 7,687,885 | B2 | * | 3/2010 | Hashimoto et al. | 257/532 |
| 8,330,264 | B2 | * | 12/2012 | Sun et al. | 257/686 |
| 8,436,429 | B2 | * | 5/2013 | Xue et al. | 257/401 |
| 8,686,546 | B2 | * | 4/2014 | Ho et al. | 257/676 |
| 2005/0023671 | A1 | * | 2/2005 | Hirashima et al. | 257/692 |
| 2006/0017159 | A1 | * | 1/2006 | Kamata | 257/737 |
| 2011/0109287 | A1 | | 5/2011 | Nakamura et al. | 323/282 |
| 2012/0001200 | A1 | | 1/2012 | Ikoshi | 257/77 |
| 2012/0068320 | A1 | * | 3/2012 | Yang et al. | 257/676 |
| 2012/0126406 | A1 | * | 5/2012 | Dix | 257/738 |

FOREIGN PATENT DOCUMENTS

JP 58175839 A 10/1983 ............. H01L 21/60

OTHER PUBLICATIONS

International Search Report and Written Opinion, Application No. PCT/US2014/019728, 25 pages, Aug. 12, 2014.

* cited by examiner

*Primary Examiner* — Alexander Oscar Williams
(74) *Attorney, Agent, or Firm* — King & Spalding L.L.P.

(57) ABSTRACT

A semiconductor power chip, may have a semiconductor die having a power device fabricated on a substrate thereof, wherein the power device has at least one first contact element, a plurality of second contact elements and a plurality of third contact elements arranged on top of the semiconductor die; and an insulation layer disposed on top of the semiconductor die and being patterned to provide openings to access the plurality of second and third contact elements and the at least one first contact element.

30 Claims, 9 Drawing Sheets

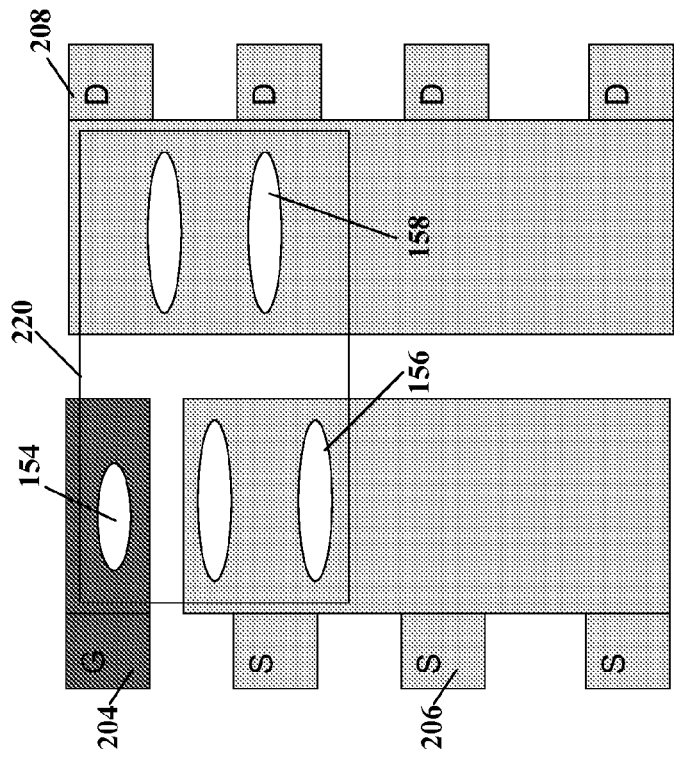
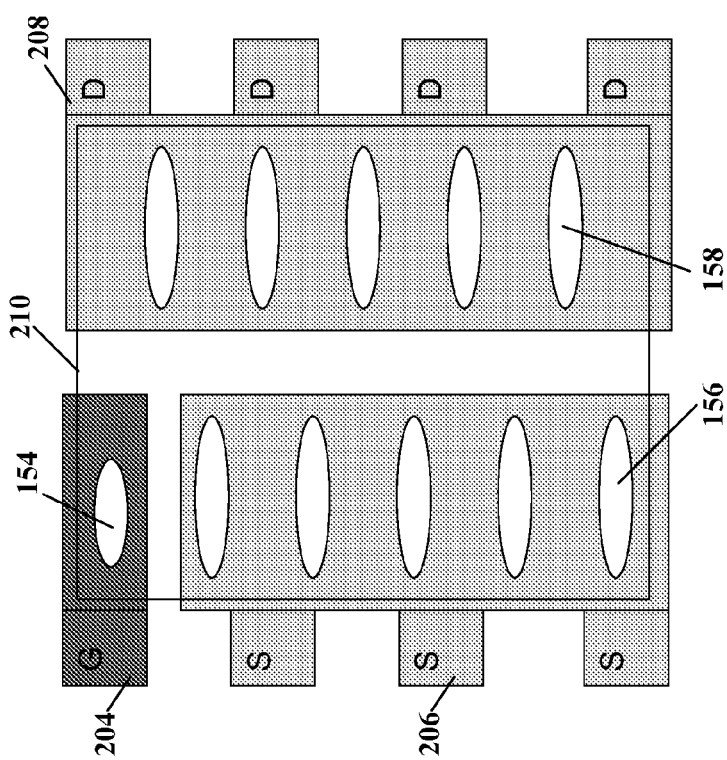

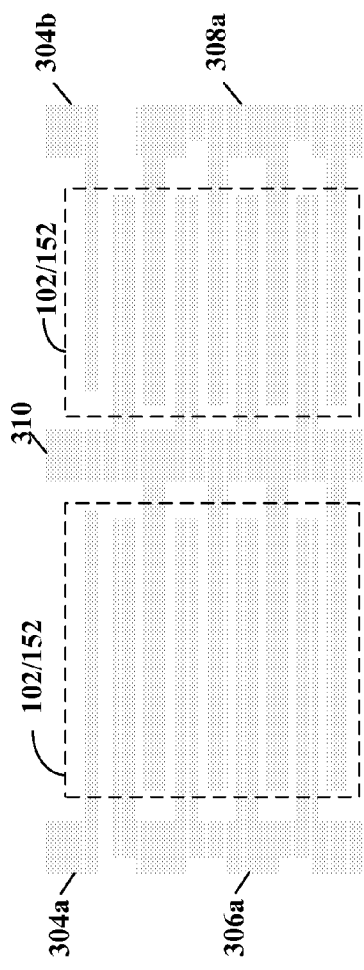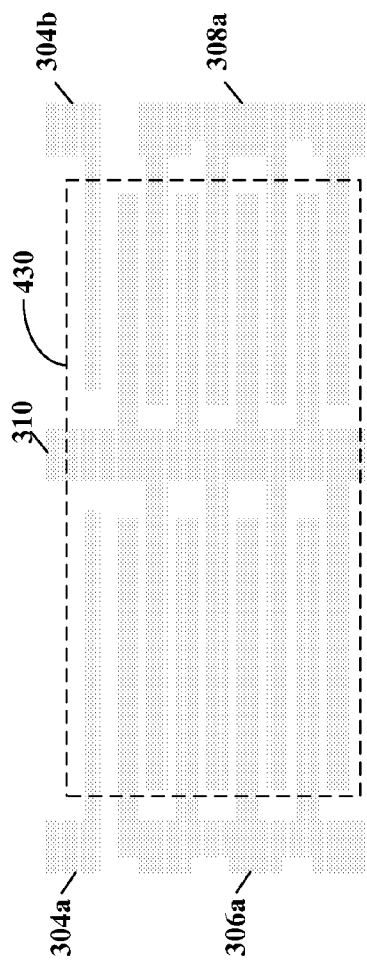

INSULATED BUMP BONDING

TECHNICAL FIELD

The present disclosure relates to semiconductor power devices, and more particularly, to fabrication of a semiconductor power device to a lead-frame using bump bonding to distribute current between the lead-frame and the source, drain and gate elements of the semiconductor power device.

BACKGROUND

Semiconductor power devices operate at high current densities, and as such, require current carrying conductors having low enough contact resistances to adequately handle the current to and from the device. There are limitations, however, for metal deposition thickness during fabrication of the semiconductor power device. This metal deposition thickness limitation necessitates having to deposit metal conductors on both the front and back sides of the semiconductor power device, e.g., power field effect transistor (power-FET). But having to use back side contact of the power element(s) of the device, e.g., drain requires extensive processing to eliminate the series resistance of the semiconductor substrate, thereby adding significant cost to the final semiconductor power product.

To distribute current better on a semiconductor power device, bump bonding is generally known from US Patent Publication US2012/0126406 which has been assigned to Applicant. This technique allows to reduce processing steps in manufacturing a semiconductor power device, and thereby reduces manufacturing costs thereof.

SUMMARY

There exists a need to further reduce manufacturing costs of a semiconductor power device and to improve its performance.

According to an embodiments, a semiconductor power chip, may comprise a semiconductor die having a power device fabricated on a substrate thereof, wherein the power device comprises at least one first contact element, a plurality of second contact elements and a plurality of third contact elements arranged on top of said semiconductor die; and an insulation layer disposed on top of the semiconductor die and being patterned to provide openings to access said plurality of second and third contact elements and the at least one first contact element.

According to a further embodiment, the first contact element is a gate contact element, the second contact element is a source contact element, and the third contact element is a drain contact element. According to a further embodiment, the opening may have a circular or elliptical shape. According to a further embodiment, each contact element may have the form of an elongated strip and may be made of copper. According to a further embodiment, the insulation layer may have a thickness of 1 to 2 mils. According to a further embodiment, first second and third contact elements can be made from copper and wherein solder is disposed within each opening.

According to another embodiment, a semiconductor power device may comprise a semiconductor power chip as described above and further comprise connecting material disposed within each opening; and a lead-frame comprising gate, source and drain lead-fingers placed on top of the die and connected with the plurality of contact elements of the gate, source and drain via the connecting material.

According to a further embodiment of the semiconductor power device, each lead finger has the form of an elongated strip. According to a further embodiment of the semiconductor power device, the lead frame further may comprise left and right connection elements that interconnect the drain and source lead fingers, respectively. According to a further embodiment of the semiconductor power device, the drain and source lead fingers can be arranged alternatively to form a inter-digital structure. According to a further embodiment of the semiconductor power device, the lead frame can be sized to match up with the plurality of contact elements. According to a further embodiment of the semiconductor power device, the lead frame can be substantially larger than a die of the semiconductor power chip. According to a further embodiment of the semiconductor power device, first second and third contact elements can be made from copper and wherein the connecting material is solder.

According to yet another embodiment, a semiconductor power device may comprise at least a first and second semiconductor power chip, each semiconductor power chip being formed as described above, and may further comprise connecting material disposed within each opening; and a lead-frame having an first and second area each first and second area comprising gate, source and drain lead-fingers placed on top of the semiconductor power chip and connected with the plurality of contact elements of the gate, source and drain of said first and second semiconductor chips, respectively via said connecting material.

According to a further embodiment of the semiconductor power device, each lead finger may have the form of an elongated strip. According to a further embodiment of the semiconductor power device, the lead frame further may comprise left and right connection elements for each of said first and second power semiconductor chips that interconnect the drain and source lead fingers, respectively. According to a further embodiment of the semiconductor power device, the drain and source lead fingers can be arranged alternatively to form a inter-digital structure. According to a further embodiment of the semiconductor power device, the lead-frame may also connect together a source of said first semiconductor chip and a drain of said second semiconductor chip or sources of said first and second semiconductor chips. According to a further embodiment of the semiconductor power device, first second and third contact elements can be made from copper and wherein the connecting material is solder.

According to yet another embodiment, a semiconductor device may comprise a semiconductor power chip as described above and further comprise another chip; connecting material disposed within each opening of the semiconductor power chip; and a lead-frame having a first area comprising gate, source and drain lead-fingers placed on top of said semiconductor power chip and connected with the plurality of connecting elements of each of the gate, source and drain of the semiconductor power chip via said connecting material and a second area configured for wire bonding said another chip.

According to a further embodiment of the semiconductor power device, each lead finger may have the form of an elongated strip. According to a further embodiment of the semiconductor power device, the lead frame further may comprise left and right connection elements that interconnect the drain and source lead fingers, respectively. According to a further embodiment of the semiconductor power device, the drain and source lead fingers can be arranged alternatively to form a inter-digital structure. According to a further embodiment of the semiconductor power device, the another chip can be a microcontroller chip operable to control said semiconductor power chip. According to a further embodiment of the semiconductor power device, the another chip can be a pulse width modulation chip operable to control said semiconductor power chip.

According to yet another embodiment, a semiconductor device may comprise at least a first and second semiconductor power chip, each semiconductor power chip being formed as described above, and further comprise a third chip; connecting material disposed within each opening of the first and second semiconductor power chip, respectively; and a lead-frame having an first and second area each first and second area comprising gate, source and drain lead-fingers adapted to be connected with the contact elements of the gate, source and drain of said first and second semiconductor chips via said connecting material, respectively and a third area configured for wire bonding said another chip.

According to a further embodiment of the semiconductor power device, each lead finger for said first and second semiconductor power chip may have the form of an elongated strip, wherein the lead frame further comprises for each of said first and second semiconductor power chips left and right connection elements that interconnect the drain and source lead fingers, respectively and wherein the drain and source lead fingers are arranged alternatively to form a inter-digital structure. According to a further embodiment of the semiconductor power device, the third chip can be a microcontroller chip operable to control said semiconductor power chip or a pulse width modulation chip operable to control said semiconductor power chip.

According to yet another embodiment, a semiconductor package may comprise a first and second semiconductor power chips as described above, and further comprise connecting material disposed within each opening of the first and second semiconductor chip; and a lead-frame comprising first and second gate, a common source and first and second drain lead-fingers placed on top of the die wherein the first gate lead finger is connected with the gate contact element of the first semiconductor chip, the first drain lead finger is connected with the plurality of drain contact elements of the first semiconductor chip, the second gate lead finger is connected with the gate contact element of the second semiconductor chip, the second drain lead finger is connected with the plurality of drain contact elements of the second semiconductor chip, and the common source lead finger is connected with the plurality of source contact elements of the first and second semiconductor chip.

BRIEF DESCRIPTION OF THE DRAWINGS

A more complete understanding of the present disclosure thereof may be acquired by referring to the following description taken in conjunction with the accompanying drawings wherein:

FIGS. 2A-2D illustrate further schematic plan views of semiconductor power devices according to further example embodiments;

FIGS. 4A-4C show top views of various lead frame structures with mounted semiconductor chips according to various embodiments;

Figure 1A:
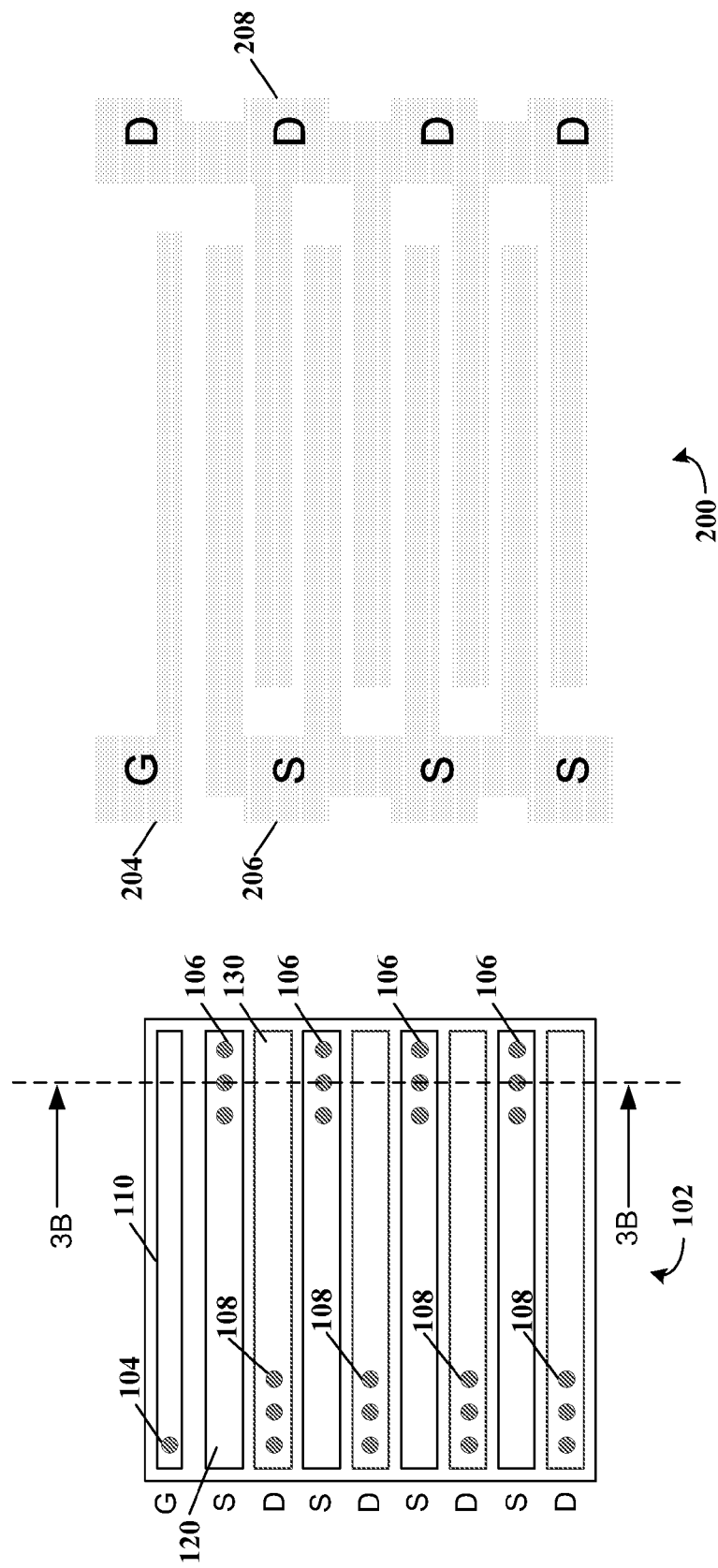
FIG. 1A illustrates a schematic plan view of a semiconductor power device and a plan view of a lead-frame, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, using a bump or loaf array to distribute the current between elements of the semiconductor power device and a much thicker lead-frame eliminates the need for a separate backside contact and subsequent processing step(s). The bump or loaf array may be in strip form. A top side of a semiconductor is then further processed after these ball bumps or loaf bumps have been formed by adding an insulating layer on top of these bumps and pattern it to provide openings for the solder. The openings are then filled with bump solder or any other suitable connecting material. Thus, assembly of the flip chip arrangement with a lead frame can be simplified for manufacturing of, e.g., a power field effect transistor (FET) device. Using an additional insulating layer with respective openings eliminates the need for intricate lead-frames and tight alignment tolerances for flip chip assembly in particular for front side only power devices. The semiconductor power device may then be attached to a lead-frame using flip-chip ball bond techniques. This results in lower processing and manufacturing costs, and a smaller form-factor for the semiconductor power device. Low resistance substrates are not needed and an epitaxial silicon growth step is eliminated. Such a mounted power device can be combined and connected to a second chip within a housing, wherein the second chip may comprise a microcontroller or pulse width modulation controller.

Advantages of using the bump flip-chip to lead-frame fabrication technique, according to the teachings of this disclosure are: 1) wafer-level-chip-scale-package solutions, 2) multiple power-FETs can be interconnected in a single package, 3) the semiconductor power die can incorporate both the source and the drain contacts on one face of the die since the lead-frame carries and distributes the device operating current. The patterned dielectric top layer simplifies the lead frame, as for example, a common lead frame may be used for different product sizes. The improved technique still provides for a very low connection resistance.

Referring now to the drawing, the details of specific example embodiments are schematically illustrated. Like elements in the drawings will be represented by like numbers, and similar elements will be represented by like numbers in some embodiments using the prime reference symbol.

Referring to FIG. 1A, depicted is a schematic plan view of a semiconductor power device and a plan view of a lead-frame, according to a specific example embodiment of this disclosure. A power semiconductor die 102 comprises gate (G), drain (D) and source (S) bumps 110, 120, 130, respectively which may be shaped in strip form as shown in FIG. 1A to provide a connection to the underlying metal layers. A dielectric layer will then be applied to the top of this structure and patterned to provide openings 104, 106, 108. These openings are then filled with solder or any other suitable connecting material to provide for a physical and electrical connection between a lead frame and the active areas of the semiconductor die. The bump fingers 110, 120, 130 can be formed by a suitable material such as a patterned metal layers deposited on the top of the interconnect metal layers, for example, on the top of the second metal layer. For example, the source and drain regions will be connected to metal runners on a first metal layer, then a second layer of metal will form wider metal runners that will be where the metal of the top contacts will be deposited.

As shown on the left side, according to one embodiment, after a dielectric layer is applied to cover the drain, source and gate bumps, the circular opening 104, 106 and 108 are formed at different locations by a suitable photochemical process. The gate bump finger 110 only comprises a single circular opening as no high currents will flow to the gate. However, according to other embodiments, more than one circular opening may be provided. For each source and drain bump finger 120, 130 three circular openings are provided wherein the circular opening 106 for the source bump fingers 120 are all arranged on the right side wherein the circular openings 108 for the drain fingers 130 are arranged similarly on the left side.

In summary, the drain and source areas will connect through standard interconnect technology to a final metal layer. After placing the bump finger on top of the device which connect to the final metal layer, a dielectric layer will be applied. This insulating layer will be patterned to create openings in the insulating layer which are filled with solder to be able to connect a lead frame on top of the semiconductor device.

The solder opening on the gate element is represented by the numeral 104. The solder opening on the source elements are represented by the numeral 106 and the solder opening on the drain elements are represented by the numeral 108. Each gate, source and drain group of the plurality of solder openings can be arranged in a group configuration on each of the respective semiconductor device gate, source and drain bump fingers. However, only the source and drain bump metal fingers require a high number of connections to provide for a very low connection resistance. Thus, the gate finger could have more openings than the single opening 104 shown in FIG. 1A. It may be more practical to provide the same number of openings in the dielectric layer over the respective bump finger and the openings may thus also form a matrix. After the openings have been formed on the bump fingers 110, 120, 130, the openings 104, 106, 108 will be filled with solder or other connecting/bonding material as will be explained in more detail with respect to FIG. 3B below.

A lead-frame 200 having a conductive frame and lead-fingers is adapted to receive and come in contact with the solder applied to the plurality of openings in the dielectric layer on top of the bump fingers of the power semiconductor die 102 in a "flip-chip" configuration. The lead-frame 104 shown in FIG. 1A is depicted in a "final state," in other words, any possible support joints between the fingers have been removed. A gate lead-finger 204 connects to the solder in opening 104, source lead-fingers 206 connect to the solder in opening 106, and drain lead-fingers 208 connect to the solder in opening 108. The lead fingers of the lead frame are elongated strips of metal corresponding in length to the bump fingers on the chip 102. Thus, these fingers are arranged alternatively as source and drain fingers shown in FIG. 1A. A connection strip arranged on one side, for example the right side, connects all drain fingers to form drain contact element 208 and correspondingly, a connection strip on the other side, for example the left side, connects all source fingers to form source contact element 206. Thus, an inter-digital structure is formed as shown in FIG. 1A. A single gate finger 204 can be arranged on either side of this structure.

Other structures than this inter-digital structure may be used wherein a plurality of bump fingers or areas that are covered by a dielectric layer and provided with solder openings for the source and drain as will be shown below in more detail.

Figure 1B:
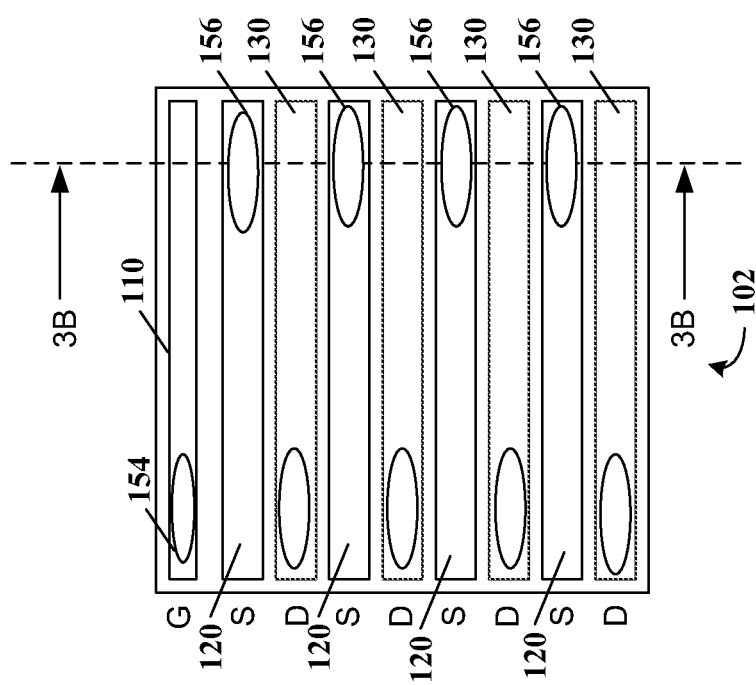
FIG. 1B illustrates a schematic plan view of a semiconductor power device according to another embodiment.

FIG. 1B shows another embodiment in which instead of a defined number of circular openings in the dielectric layer a single elliptic opening 154, 156, 158 is used covers approximately the same area than the circular openings 104, 106, 108 but provide even more actual contact area. Other shapes for the various openings may be used according to other embodiments.

Solder placed in the openings connects the lead-frame 104 to the bump fingers 110, 120, 130 through heating the lead-frame 104 and die 102 to a temperature sufficient to melt the applied solder. Conductive epoxy may also be used according to some embodiments and attach to the lead-frame 104 by heating B-staged epoxy in the openings on the die 102 sufficiently to C stage them to the lead-frame 104. Thereafter the assembly comprising the die 102 and the lead-frame 104 may be packaged or used as an unpackaged lead-frame device. As mentioned above any support structures in the lead-frame 200 that electrically connect certain elements can be removed at the appropriate manufacturing stage to provide for the proper electrical connections between the lead-frame 200 and the die.

Figure 2C:
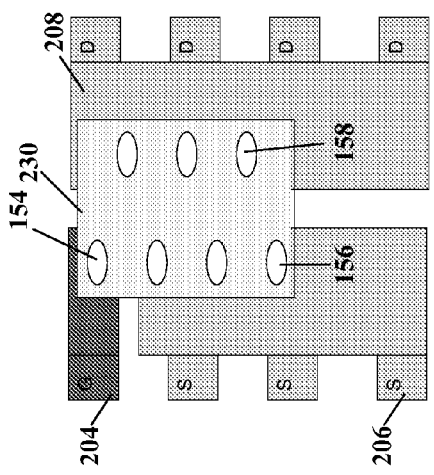

FIG. 2A shows another embodiment similar to the embodiment of FIG. 1B in which lead frame fingers 204, 206 and 208 associated with gate, source and drain respectively. The semiconductor die 210 is shown in FIGS. 2A-D upside down in a top view, thus showing its backside. However, numerals 154, 156 and 158 indicate the openings in the dielectric layer applied to the top side of the die 210. These openings 154, 156, 158 are again filled with solder or other suitable material for making electrical contact with a lead frame fingers 204, 206, 208. Each opening 154, 156, 158 in the dielectric layer above the respective bump structures 204, 206, 208 may extends along a certain area and may have as shown for example an elliptical footprint. Again, the gate bump finger 110 may only use a single elliptical opening 154 to connect to lead frame finger 204 as no high currents will flow through it. Alternatively, other shapes for the various openings may apply. The single opening above the gate bump is represented by the numeral 154. The openings above the source bump are represented by the numeral 156 and the openings above the drain bump are represented by the numeral 158. FIG. 2A shows a lead frame 204, 206, 208 for single die, wherein the die that has approximately the same size. As shown in FIG. 2A, the lead frame provides for a gate frame finger 204, a source frame finger 206 and a drain frame finger 208. Drain and source frame fingers 204, 206 and 208 each will be connected through five openings 154, 156, and 158 in the dielectric layer applied to the top of the die 210 by means of respective solder that has been placed in the openings. The embodiment shown in FIG. 2A uses larger solder openings than the embodiment of FIG. 1A for even lower resistance as the current does not have to travel as far in the "loaf".

Figure 2D:
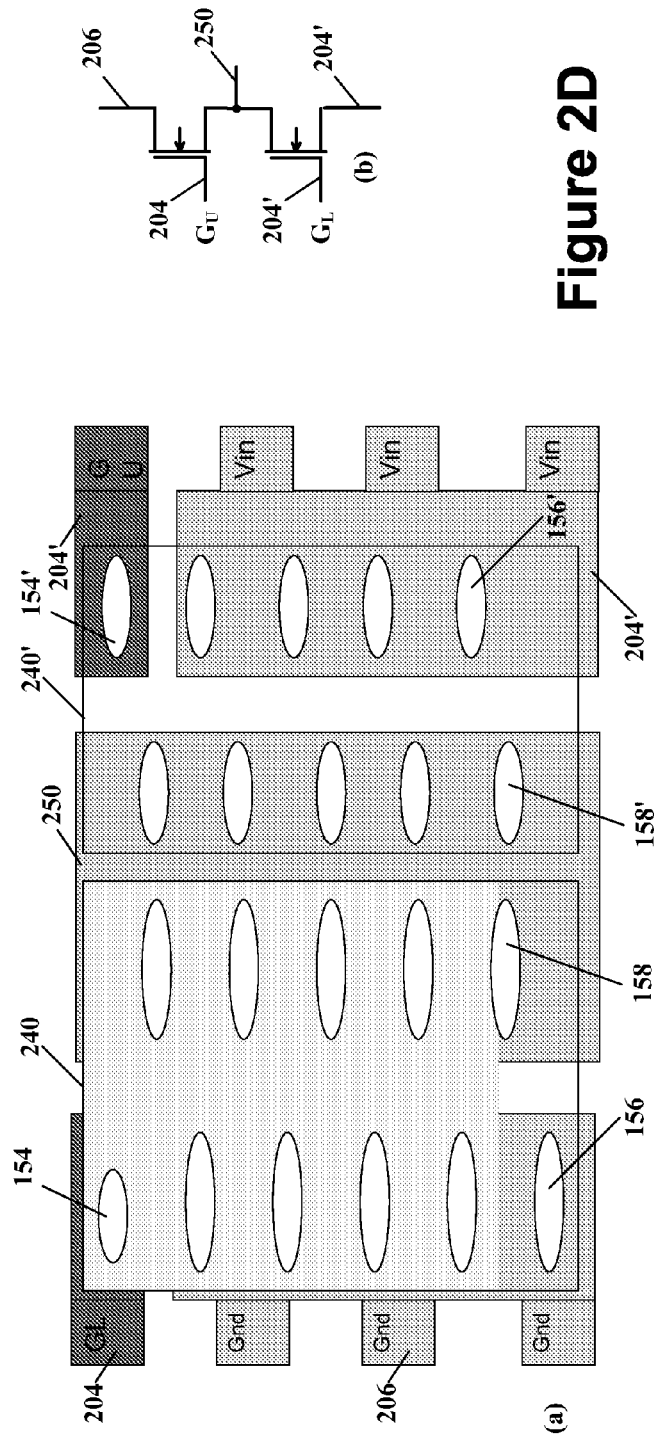

As shown in FIGS. 2B and 2C, this lead frame could also be used for several different size die, for example die 220 or die 230. The die would therefore be scaled and may have less openings 156 and 158 in the dielectric layer as shown in FIGS. 2B and 2C. Fig. The embodiment in FIG. 2B uses the same lead frame as the embodiment of FIG. 2A wherein the die is smaller with respect to the vertical scale. The embodiment in FIG. 2C uses the same lead frame as the embodiment of FIG. 2A wherein the die is smaller with respect to the vertical and horizontal scale. FIG. 2D shows another embodiment in which a lead frame is designed to receive more than one die. For example, two dies 240 and 240' may be placed on a lead frame having two gate frame fingers 204, 204', two drain frame fingers 206, 206' and a common source frame finger 250 to connect through the respective openings 154, 154' 156, 156' 158, 158' in the top dielectric layer by means of, e.g. solder. According to some embodiments, the actual bumps are formed of copper and the connecting material is solder. Thus, according to some embodiments, the openings are filled with appropriate amount of solder. Other embodiments, may use conductive epoxy or other suitable material for the bumps and the actual connecting material may then consist of the same material as the underlying bumps. An electrical schematic interconnection diagram of the two semiconductor power devices is shown at (b).

Figure 3A:
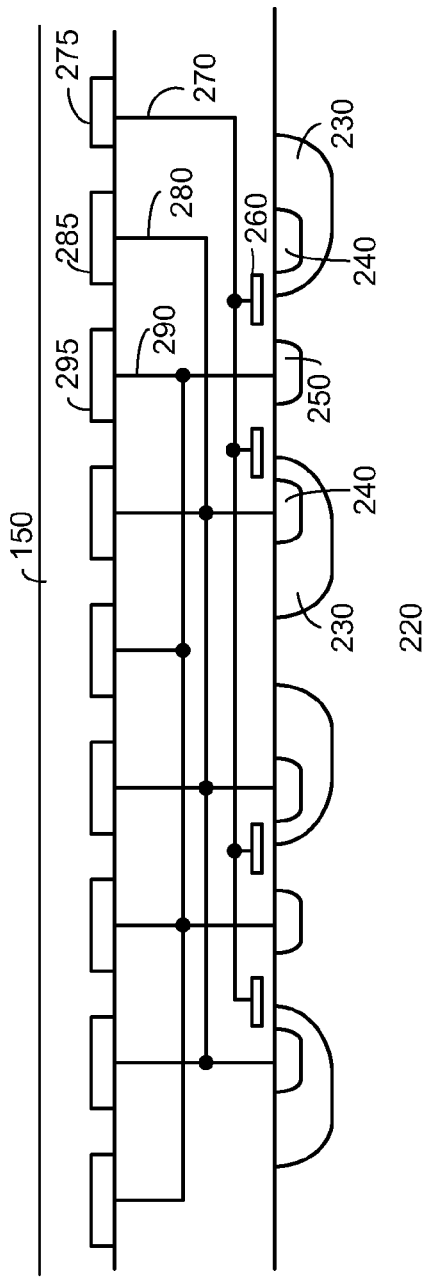
FIG. 3A shows a possible embodiment of a transistor in a semiconductor die.

FIG. 3A shows a cross section through a possible embodiment of a power transistor with bump structures 275, 285, 295 and un-patterned insulating layer 150 deposited on the top side. As can be seen a standard field effect power transistor may be formed by a plurality of cells coupled in parallel. A cell can be formed symmetrically as shown in FIG. 3A. Here, on a substrate 210 a epitaxial layer 220 is formed. within the epitaxial layer 220, a cell may be formed by two base regions 230 in which source regions 240 are embedded. In-between the two base regions, a drain region 250 may be formed. For each cell, two gates 260 are formed within an insulation layer on top of the epitaxial layer 220, wherein the gates 260 at least cover a lateral channel region within the base region between the source region 240 and the epitaxial layer 220. Other cells are arranged next to this cell. Also, other cell structures can be used, for example, the base and source region can be symmetrical so that a base region can also be used for a neighboring cell. As discussed above, a two metal layer structure can be used to interconnect the source, drain, and gate of each transistor of each cell with the bump structure 275, 285, 295 as schematically shown in FIG. 3A. These structures may have different shapes and can be, for example, have the form of a strip. However, other shapes can be used depending on the actually underlying design of the device. The first metal layer provides for narrow contact to the source and drain regions and also provides for interconnection of the gates. The second metal layer is used to connect the first metal layer structures with the respective metal fingers on top of which the bump structures 275, 285, 295 are formed. As further shown in FIG. 3A, an insulating layer 150 is deposited on top of the semiconductor die. FIG. 3A shows a state before the insulating layer 150 is patterned.

Figure 3B:
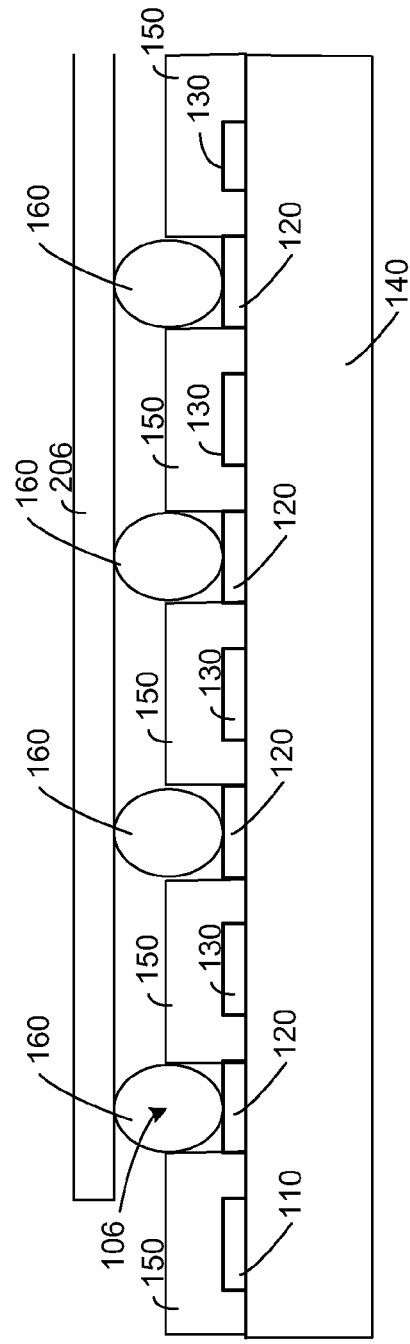
FIG. 3B shows a cross-section view along the line 3B-3B in FIG. 1A or FIG. 1B.

FIG. 3B shows a sectional view along lines 3B-3B of FIG. 1A or FIG. 1B. FIG. 3B shows no details of the power transistor structures within the die 140. Thus, the metal layers are not depicted in FIG. 3B and only the bump structures 110, 120, 130 are shown. The spacing between bump fingers as shown in FIGS. 1A and B can be, for example, ~55 microns or ~2 mils and the bump fingers may be ~150 microns or 6 mils wide.

FIG. 3B shows how the insulating layer 150 could be patterned to provide openings 104, 106, 108 for access to the respective bump structures 110, 120 and 130 wherein the sectional view only shows the openings for the source bump 120. The insulating layer 150 may be a dry film laminate, or spray on dielectric like polyemit or epoxy based material. Nominally it can be 1 to 2 mils thick according to some embodiments. After the insulating layer 150 has been patterned by a photochemical process to provide openings to the underlying bump structures 110, 120 and 130, these openings are filled with solder 160. FIG. 3B, furthermore shows the lead frame finger 206 for connection to the source placed above the solder balls 160 before the device is heated to create a permanent connection.

Figure 4C:
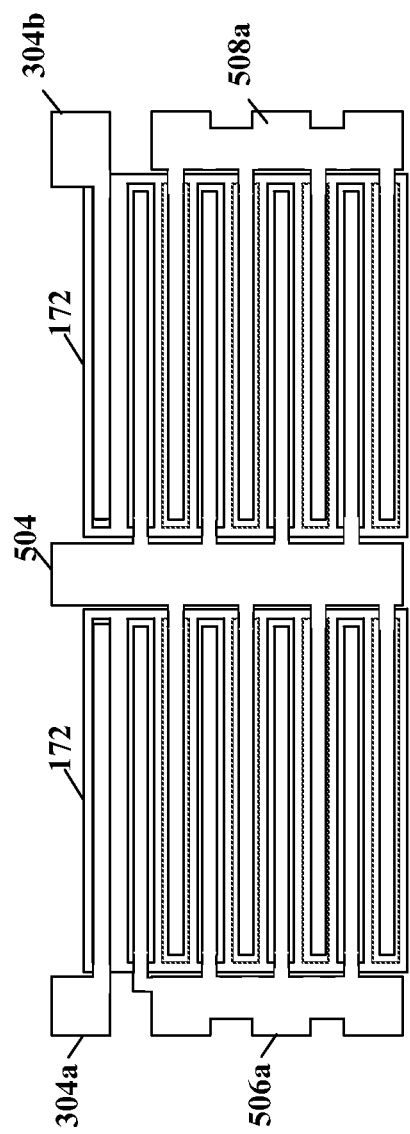

FIGS. 4A-C show examples of mounted semiconductor power chips on a lead-frame according to various embodiments. In FIG. 4A two separate power semiconductor chips 102 or 152 formed according to FIGS. 1A-B, 2A-C, and 3B are placed on the lead-frame. Each device is thus insulated from the other device. FIG. 4B shows an example with a single chip 430 formed according to the principles shown in FIGS. 1A-B, 2A-C, and 3B covering both inter-digital source-drain-gate contact areas. Thus, the chip 430 must provide for insulated devices within the epitaxial layer. This could be done by providing each transistor in its own designated well as otherwise the drains of each device would be shorted.

FIG. 4C shows an example of a lead frame similar to the one of FIG. 4A or 4B structured to connect to two separate semiconductor dies 172, 173 each manufactured according to various embodiments of this disclosure.

Figure 5:
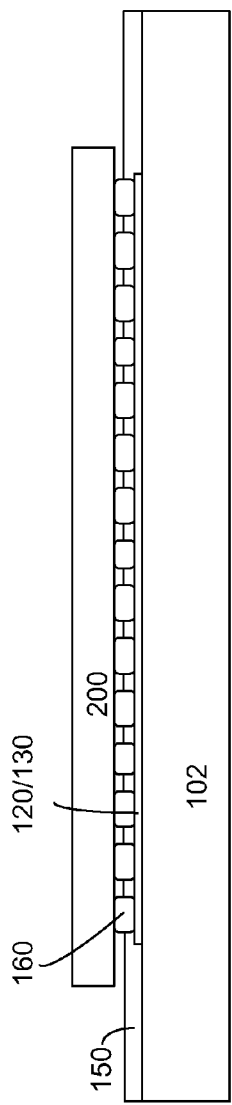
FIG. 5 shows a cross section of a mounted power semiconductor chip on a lead-frame according to various embodiments.

FIG. 5 shows a cross sectional view of a mounted power transistor chip 102 on a lead-frame 200 using solder 160. The sectional view is taken through a source or drain finger providing a plurality of openings along its length and after heating and bonding but before packaging. However, as discussed less openings can be provided and it is not required to provide as many openings as shown in FIG. 5

Figure 6:
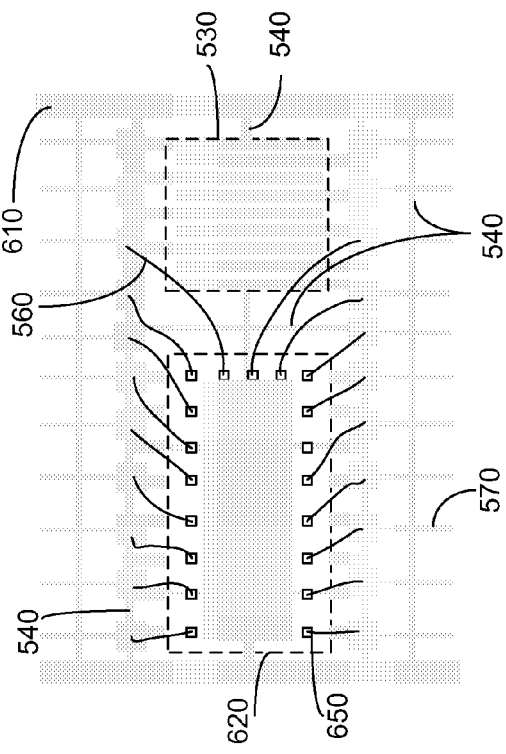
FIGS. 6-8 show various examples of single and multiple chips mounted on a lead-frame.

FIG. 6 shows a first example of a chip 530 mounted on a lead-frame 510 as explained above similar to the embodiment of FIGS. 1A and B. The lead frame could also have the shape as shown in FIGS. 2A-C. The lead-frame may have a plurality of external pins 570, in the shown example 8 pins. Instead of pins, the lead frame could of course also provide for pads as used in no-lead packages for example QFN or DFN packages. The power transistor chip 530 shown uses four pins 570 for the drain connection and three pins 570 for the source connection. A single pin is used for the gate connection. For mounting purposes and before encapsulation, the lead-frame may comprise a plurality of support connections, three of which are referenced by reference symbol 540. The pins 570 for the external connection may be single pins or form a group of connected pins as shown in FIG. 6. Thus, any support connection between these pins within a group may remain. Also according to other embodiments, wider pins may be used for the source drain connection to support a higher current.

Certain applications of control circuits, in particular microcontroller applications, require the control of power transistors, for example, switch mode power supply controllers, buck converters or motor control applications. Such applications therefore use generally separate discrete power transistors. According to various embodiments, a pulse width modulator or even a microcontroller can be packaged together with a power transistor as described above.

Figure 7:
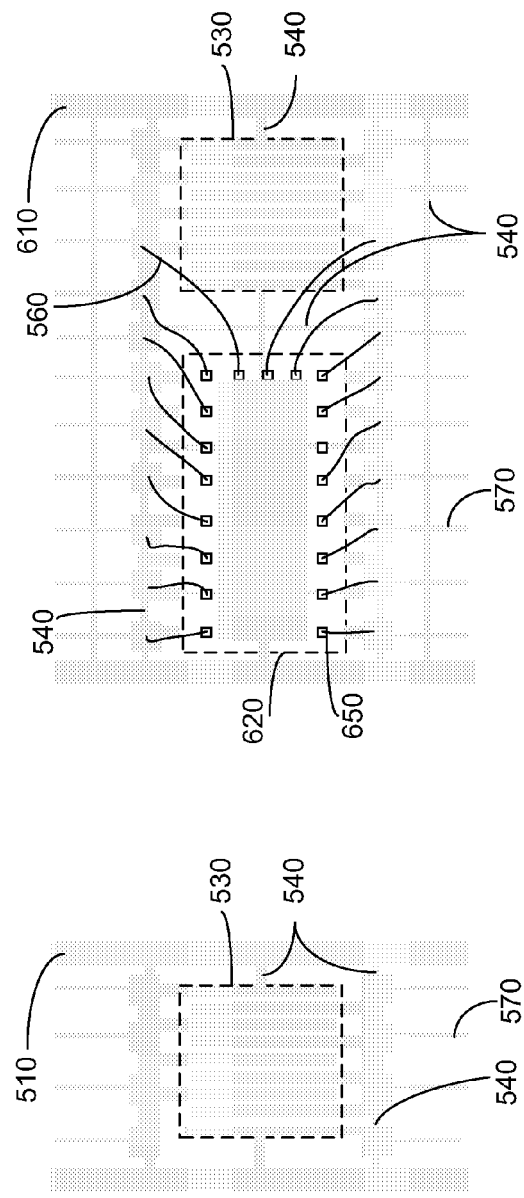

FIG. 7 shows an example of a lead-frame 610 that can support a first chip 620, for example a microcontroller chip, coupled to the lead-frame 610 in conventional bonding technique and a second chip 530 comprising one a power transistor as described above and mounted to the lead-frame using the above mentioned flip chip bump bonding technique. Again a lead frame structure for the transistor chip as shown in FIGS. 2A-C may be used. Reference symbol 570 again indicates an external pin of the lead-frame 510. Lead-frame 610 is furthermore shown in FIG. 7 with a plurality of support connections, four of them indicated by reference symbol 540. As mentioned above, these support structures are cut out before enclosing the device in a housing to eliminate any unwanted shorts in the frame and proper connection to the designated pin 570. As shown the first chip 620 can be interconnected to at least one of the source, drain and gate fingers at appropriate connection points on the lead-frame 610. While the first chip 620 uses single pins 570 for each connection to a bond pad 650, the section of the lead-frame for the second chip may again connect multiple pins 570 to each source and drain connection to provide a low resistance and support for high currents. However, other external pins, for example, wider pins may be used for the source and/or drain contacts of the second chip 530 according to various embodiments. As mentioned above, the first chip 520 can be a pulse width modulation device, a controller or a microcontroller operable to directly interface with a power transistor. to this end, these devices have integrated drivers that are capable of directly driving the gate of the power transistor.

Figure 8:
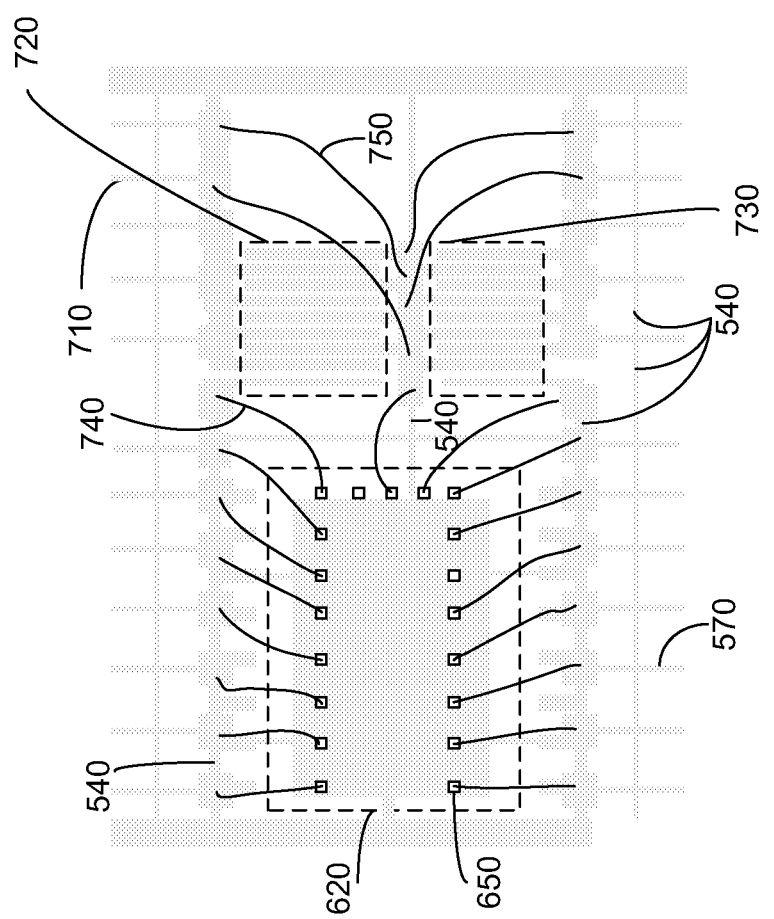

FIG. 8 shows yet another embodiment comprising a lead-frame 710 with a microcontroller chip 620 connected by standard wire-bonding and two power transistor chips 720 and 730 mounted in flip chip technology as explained above. The section with the two power transistors corresponds to the lead-frame shown in FIG. 4. Again, instead of the structure shown on the right side for dies 730 and 740, the lead frame structure as shown in FIG. 2D may be used. Here, additional external pins 710 are provided in comparison with FIG. 7 for coupling with the interconnected source-drain section 310 via bonding wires 750. Any source, drain and/or gate of the two transistor chips 720, 730 may be connected to a bond pad 650 via a bond wire 740 of the microcontroller chip 620 as exemplarily shown in FIG. 9. Again, FIG. 8 shows a plurality of support structures 540 that will be removed before encapsulation.

The embodiments shown in the various figures are not restricted to field effect transistors but may also be used for any type of bipolar transistor structure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A semiconductor power chip, comprising:
   a semiconductor die comprising a power device, at least one first contact element, a plurality of second contact elements and a plurality of third contact elements arranged on top of said semiconductor die, wherein the at least one first contact element, the plurality of second contact elements and the plurality of third contact elements are configured to provide an external connection of the power device;
   an insulation layer disposed on top of the semiconductor die, wherein the insulation layer covers the at least one first contact element, the plurality of second contact elements and the plurality of third contact elements and wherein the insulation layer is patterned to provide openings to access said plurality of second and third contact elements and the at least one first contact element.

2. A semiconductor power chip according to claim 1, wherein the first contact element is a gate contact element, the second contact element is a source contact element, and the third contact element is a drain contact element.

3. A semiconductor power chip according to claim 1, wherein the opening has a circular or elliptical shape.

4. A semiconductor power chip according to claim 1, wherein each contact element has the form of an elongated strip and is made of copper.

5. A semiconductor power chip according to claim 1, wherein the insulation layer has a thickness of 1 to 2 mils.

6. A semiconductor power chip according to claim 1, wherein first second and third contact elements are made from copper and wherein solder is disposed within each opening.

7. A semiconductor power device, comprising a semiconductor power chip according to claim 2, further comprising:
   connecting material disposed within each opening;
   a lead-frame comprising gate, source and drain lead-fingers placed on top of the die and connected with the plurality of contact elements of the gat; source and drain via the connecting material.

8. The semiconductor power device according to claim 7, wherein each lead finger has the form of an elongated strip.

9. The semiconductor power device according to claim 8, wherein the lead frame further comprises left and right connection elements that interconnect the drain and source lead fingers, respectively.

10. The semiconductor power device according to claim 9, wherein the drain and source lead fingers are arranged alternatively to form an inter-digital structure.

11. The semiconductor power device according to claim 7, wherein the lead frame is sized to match up with the plurality of contact elements.

12. The semiconductor power device according to claim 7, wherein the lead frame is substantially larger than a die of the semiconductor power chip.

13. The semiconductor power device according to claim 1, wherein first second and third contact elements are made from copper and wherein the connecting material is solder.

14. A semiconductor power device, comprising at least a first and second semiconductor power chips, each semiconductor power chip being formed according to claim 2, further comprising:
   connecting material disposed within each opening;
   a lead-frame having a first and second area, each of the first and second area comprising gate, source and drain lead-fingers placed on top of the semiconductor power chip and connected with the plurality of contact elements of the gate, source and drain of said first and second semiconductor chips, respectively via said connecting material.

15. The semiconductor power device according to claim 14, wherein each lead finger has the form of an elongated strip.

16. The semiconductor power device according to claim 14, wherein the lead frame further comprises left and right connection elements for each of said first and second power semiconductor chips that interconnect the drain and source lead fingers, respectively.

17. The semiconductor power device according to claim 16, wherein the drain and source lead fingers are arranged alternatively to form an inter-digital structure.

18. The semiconductor power device according claim 14, wherein the lead-frame also connects together a source of said first semiconductor chip and a drain of said second semiconductor chip or sources of said first and second semiconductor chips.

19. The semiconductor power device according claim 14, wherein first second and third contact elements are made from copper and wherein the connecting material is solder.

20. A semiconductor device comprising a semiconductor power chip according to claim 2, further comprising:
   another chip;
   connecting material disposed within each opening of the semiconductor power chip;
   a lead-frame having a first area comprising gate, source and drain lead-fingers placed on top of said semiconductor power chip and connected with the plurality of connecting elements of each of the gate, source and drain of the semiconductor power chip via said connecting material and a second area configured for wire bonding said another chip.

21. The semiconductor power device according to claim 20, wherein each lead finger has the form of an elongated strip.

22. The semiconductor power device according to claim 21, wherein the lead frame further comprises left and right connection elements that interconnect the drain and source lead fingers, respectively.

23. The semiconductor power device according to claim 22, wherein the drain and source lead fingers are arranged alternatively to form an inter-digital structure.

24. The semiconductor device according to claim 20, wherein the another chip is a microcontroller chip operable to control said semiconductor power chip.

25. The semiconductor device according to claim 20, wherein the another chip is a pulse width modulation chip operable to control said semiconductor power chip.

26. A semiconductor device comprising at least a first and second semiconductor power chip, each semiconductor power chip being formed according to claim 2, further comprising:
   a third chip;
   connecting material disposed within each opening of the first and second semiconductor power chip, respectively;
   a lead-frame having an first and second area each first and second area comprising gate, source and drain lead-fingers adapted to be connected with the contact elements of the gate, source and drain of said first and second semiconductor chips via said connecting material, respectively and a third area configured for wire bonding said another chip.

27. The semiconductor power device according to claim 26, wherein each lead finger for said first and second semiconductor power chip has the form of an elongated strip, wherein the lead frame further comprises for each of said first and second semiconductor power chips left and right connection elements that interconnect the drain and source lead fingers, respectively and wherein the drain and source lead fingers are arranged alternatively to form an inter-digital structure.

28. The semiconductor device according to claim 26, wherein the third chip is a microcontroller chip operable to control said semiconductor power chip or a pulse width modulation chip operable to control said semiconductor power chip.

29. A semiconductor package, comprising a first and second semiconductor power chip according to claim 2, further comprising:
   connecting material disposed within each opening of the first and second semiconductor chip;
   a lead-frame comprising first and second gate, a common source and first and second drain lead-fingers placed on top of the die wherein the first gate lead finger is connected with the gate contact element of the first semiconductor chip, the first drain lead finger is connected with the plurality of drain contact elements of the first semiconductor chip, the second gate lead finger is connected with the gate contact element of the second semiconductor chip, the second drain lead finger is connected with the plurality of drain contact elements of the second semiconductor chip, and the common source lead finger is connected with the plurality of source contact elements of the first and second semiconductor chip.

30. A semiconductor power chip, comprising:
   a semiconductor die with a power device formed within an epitaxial layer of the semiconductor die and a metal layer structure formed on top of the epitaxial layer, at least one first contact element, a plurality of second contact elements and a plurality of third contact elements arranged on top of said semiconductor die, wherein the metal layer structure connects the least one first contact element, the plurality of second contact elements and the plurality of third contact elements with active regions in the epitaxial layer, and the at least one first contact element, the plurality of second contact elements and the plurality of third contact elements are configured to provide an external connection of the semiconductor power chip;
   an insulation layer disposed on top of the semiconductor die, wherein the insulation layer covers the at least one first contact element, the plurality of second contact elements and the plurality of third contact elements and wherein the insulation layer is patterned to provide openings to access said plurality of second and third contact elements and the at least one first contact element.

* * * * *

UNITED STATES PATENT AND TRADEMARK OFFICE
CERTIFICATE OF CORRECTION

| | | |
|---|---|---|
| PATENT NO. | : 8,921,986 B2 | Page 1 of 1 |
| APPLICATION NO. | : 13/831682 | |
| DATED | : December 30, 2014 | |
| INVENTOR(S) | : Gregory Dix et al. | |

It is certified that error appears in the above-identified patent and that said Letters Patent is hereby corrected as shown below:

In the Claims

Column 10,
Claim 7, line 25, "...plurality of contact elements of the gat; source and drain..." ---Change to---
"plurality of contact elements of the gate; source and drain..."

Signed and Sealed this
Twenty-first Day of April, 2015

Michelle K. Lee
*Director of the United States Patent and Trademark Office*